United States Patent [19]

Arai

[11] Patent Number: 5,442,220
[45] Date of Patent: Aug. 15, 1995

[54] CONSTANT VOLTAGE DIODE HAVING A REDUCED LEAKAGE CURRENT AND A HIGH ELECTROSTATIC BREAKDOWN VOLTAGE

[75] Inventor: Takao Arai, Tokyo, Japan
[73] Assignee: NEC Corporation, Tokyo, Japan
[21] Appl. No.: 28,885
[22] Filed: Mar. 10, 1993
[51] Int. Cl.[6] .................................. H01L 27/02
[52] U.S. Cl. ............................. 257/378; 257/337; 257/133; 257/146; 257/577
[58] Field of Search ............... 257/378, 337, 368, 133, 257/146, 577

[56] References Cited

U.S. PATENT DOCUMENTS 4,825,274  4/1989  Higuchi et al. ............ 257/378

Primary Examiner—Mark V. Prenty
Attorney, Agent, or Firm—Whitham, Curtis, Whitham & McGinn

[57] ABSTRACT

A semiconductor device functioning as a diode, includes an insulated-gate field effect transistor for determining a breakdown voltage, and a bipolar transistor connected to the field effect transistor for amplifying a drain current of the field effect transistor. The field effect transistor and the bipolar transistor are formed in the same semiconductor substrate.

5 Claims, 8 Drawing Sheets $I_1$ : DRAIN CURRENT
$I_2$ : COLLECTOR CURRENT

_5,442,220_

CONSTANT VOLTAGE DIODE HAVING A REDUCED LEAKAGE CURRENT AND A HIGH ELECTROSTATIC BREAKDOWN VOLTAGE

BACKGROUND OF THE INVENTION

1. Field of the Invention

The present invention relates to a planar type diode, and more specifically to a diode which can be effectively used for electrostatic protection of input/output signals in integrated circuits.

2. Description of Related Art

Conventionally, diodes used for electrostatic protection of input/output signals in integrated circuits have been required to have the following electric characteristics:

(1) In order to protect the integrated circuit from being broken by a static electricity, the breakdown voltage of the electrostatic protection diode is lower than a breakdown voltage of the integrated circuit;

(2) In order to avoid disturbance of the input/output signal, a capacitance of the electrostatic protection diode (between opposite terminals of the electrostatic protection diode) is small, and the breakdown voltage of the electrostatic protection diode is higher than a voltage of a normal input/output signal; and (3) In order to minimize a consumed electric power, a leakage current of the electrostatic protection diode is smaller than the voltage of a normal input/output signal One example of the conventional electrostatic protection diode has been constituted of a simple PN junction. In this case, a Zener breakdown is dominant, and therefore, the leakage current of the electrostatic protection diode becomes large if the required breakdown voltage becomes low. On the other hand, an operating resistance is large. For example, when the electrostatic protection diode for a 3V-signal type integrated circuit is realized of the conventional PN junction diode, a diode having its breakdown voltage of 4V has its leakage current on the order of several milliamperes at 3V. Therefore, the electrostatic protection diode for integrated circuits having an input/output signal voltage not smaller than 5V could not have been realized of the conventional diode, because of its leakage current.

An electrostatic protection diode having an NPN structure has been known. A breakdown voltage of this type diode is determined by a punch through voltage, and therefore, this type diode can have an improved leakage current. However, it has been difficult to control the breakdown voltage, and in addition, the breakdown voltage variation in the same wafer is large. Because of this reason, this type diode is not suitable to mass production.

SUMMARY OF THE INVENTION

Accordingly, it is an object of the present invention to provide a diode which has overcome the above mentioned defect of the conventional one.

Another object of the present invention is to provide a diode having a reduced operating resistance.

Still another object of the present invention is to provide a diode having a small leakage current but capable of allowing a large electrostatic current amount.

The above and other objects of the present invention are achieved in accordance with the present invention by a semiconductor device including an insulated-gate field effect transistor for determining a breakdown voltage, and a bipolar transistor connected to the field effect transistor for amplifying a drain current of the field effect transistor.

In a preferred embodiment, the field effect transistor and the bipolar transistor are formed at a first principal surface of a semiconductor substrate, a source, a drain and a gate of the field effect transistor are connected to a collector, a base and an emitter of the bipolar transistor, respectively, so that a collector-emitter characteristics of the bipolar transistor is utilized as a constant voltage diode.

Alternatively, the source of the field effect transistor is connected to the collector of the bipolar transistor, the drain and the gate of the field effect transistor are connected in common to the base of the bipolar transistor. Also in this variant, the collector-emitter characteristics of the bipolar transistor is also utilized as a constant voltage diode.

According to another aspect of the present invention, there is provided a semiconductor device including an insulated-gate field effect transistor for minimizing the leakage current and for determining a breakdown voltage, a bipolar transistor connected to the field effect transistor for amplifying a drain current of the field effect transistor, and a thyristor coupled to the field effect transistor and the bipolar transistor for improving an electrostatic breakdown current.

In a preferred embodiment, a source of the field effect transistor, a collector of the bipolar transistor and an anode of the thyristor are interconnected, and a drain of the field effect transistor, a base of the bipolar transistor and a gate of the thyristor are interconnected, and also, a gate of the field effect transistor, an emitter of the bipolar transistor and a cathode of the thyristor are interconnected.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
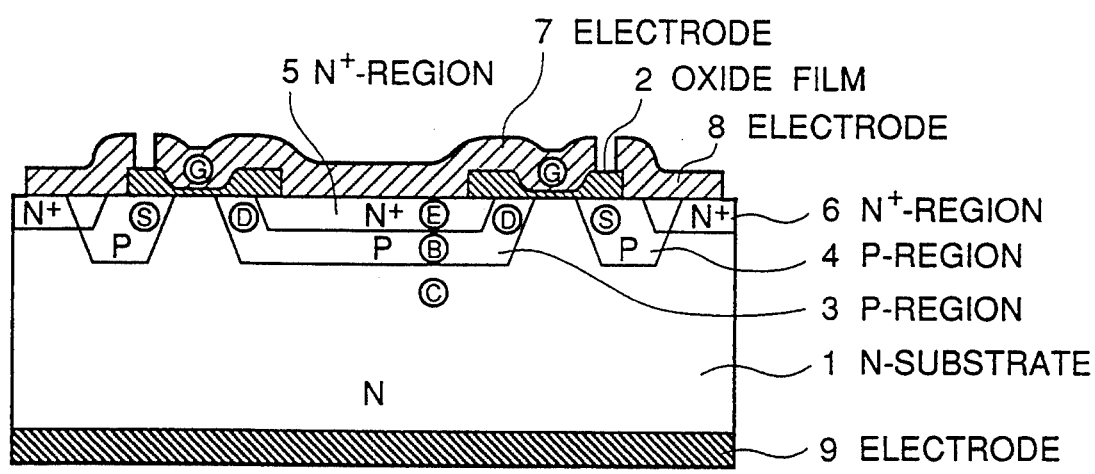
FIG. 1A is a diagrammatic sectional view of a first embodiment of the diode in accordance with the present invention.
Figure 1B:
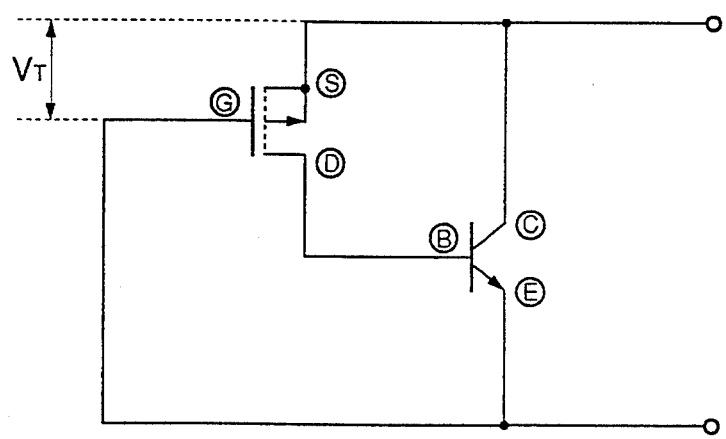
FIG. 1B is an equivalent circuit diagram of the diode shown in FIG. 1A.

Referring to FIG. 1A, there is shown a diagrammatic sectional view of a first embodiment of the constant voltage diode in accordance with the present invention. In addition, FIG. 1B is an equivalent circuit diagram of the diode shown in FIG. 1A. In FIGS. 1A and 1B, circled letters "C", "B" and "E" indicate a collector, a base and an emitter of a bipolar transistor, and also, circled letters "S", "D" and "G" designate a source, a drain and a gate of a MOS transistor (metal-oxide-semiconductor field effect transistor).

As shown in FIG. 1A, the first embodiment of the diode includes an N type semiconductor substrate 1 having P-type diffusion regions 3 and 4 which am formed by selectively patterning an oxide film on a principal surface of the substrate 1 by means of a photoresist process, and by selectively diffusing a P-type impurity into the principal surface of the substrate 1 using the patterned oxide film as a mask. The P-type region 3. constitutes a base of the bipolar transistor and a drain of the MOS transistor. The. P-type region 4 constitutes a source of the MOS transistor.

In addition, an N+ region 5 is formed in the P-type region 3, and another N+ region 6 is formed adjacent to the P-type region 4 and at an outside of the P-type region 4. These N+ regions 5 and 6 can be formed by removing the patterned oxide film used for formation of the P-type regions 3 and 4, newly forming a second oxide film on the principal surface of the substrate 1, selectively patterning the second oxide film by means of a photoresist process, and by selectively and strongly diffusing an N-type impurity into the principal surface of the substrate 1 using the second patterned oxide film as a mask. The N+ region 5 constitutes an emitter of the bipolar transistor, and the N+ region 6 constitutes a collector lead-out for a collector connection of the bipolar transistor.

The second patterned oxide film is also removed, and a third newly oxide film, which becomes a gate oxide film 2, is formed on the principal surface of the substrate 1. Thereafter, ions are implanted to a channel region between the P-type regions 3 and 4 and under the gate oxide 2, for the purpose of controlling a turn-on voltage $V_T$ of the MOS transistor. Furthermore, electrodes 7, 8 and 9 are formed as shown in FIG. 1A by an evaporation process. The electrode 7 forms as an emitter electrode of the bipolar transistor and a gate electrode of the MOS transistor. The electrode 8 constitutes a common electrode for the collector of the bipolar transistor and the source of the MOS transistor. The electrode 9 is a substrate electrode or a back electrode. Thus, the diode of a pellet structure is formed.

Now, an operation of the semiconductor device shown in FIG. 1A will be desert bed with reference to the equivalent circuit of FIG. 1B. When a negative voltage and a positive voltage are applied to the anode electrode 7 and the cathode electrode 9, respectively, if the applied voltage exceeds the turn-on voltage $V_T$, a drain current flows so that a current is injected to the base of the bipolar transistor. As a result, the bipolar transistor is turned on. The bipolar transistor exerts a current amplification, an operating resistance is low.

When a constant voltage diode having a breakdown voltage of 1V was manufactured, the following result was obtained.

Assuming that the operating resistance and the breakdown voltage variation in the same wafer (standard deviation) of the conventional diode of the punch-through breakdown type are 100, respectively, the relative value of the operating resistance and the breakdown voltage variation of the first embodiment were 27 and 25, respectively.

In other words, the operating resistance was lowered to a value less than one third of the conventional diode, and the breakdown voltage variation was reduced to one fourth of the .conventional diode. This is very advantageous, in comparison with the conventional constant voltage diode of the PN junction type having its operation resistance which becomes larger if the breakdown voltage is smaller. Therefore, if the first embodiment is used as a constant voltage diode of a low breakdown voltage, the operating resistance can be remarkably improved.

Figure 2A:
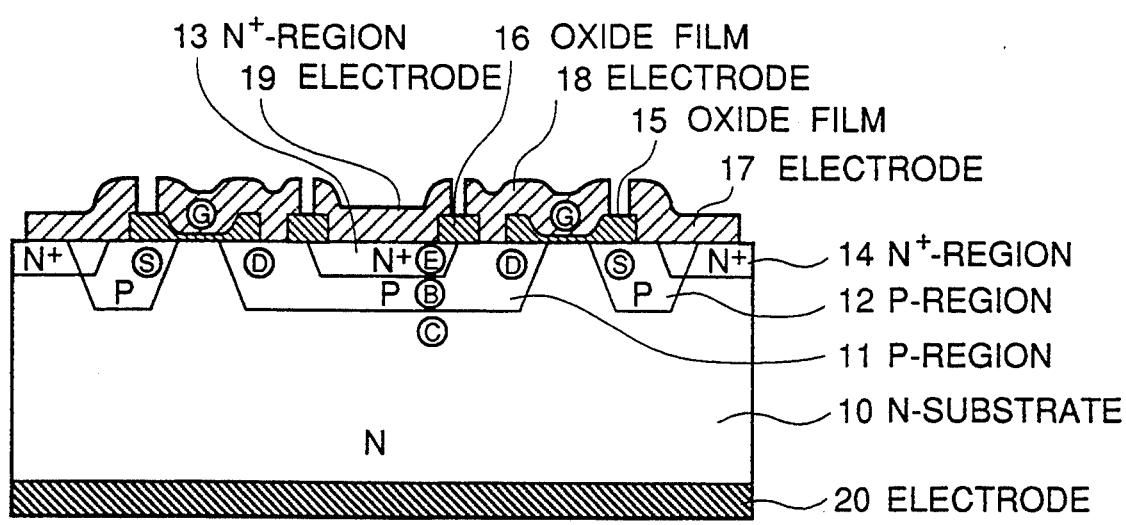
FIG. 2A is a diagrammatic sectional view of a second embodiment of the diode in accordance with the present invention.
Figure 2B:
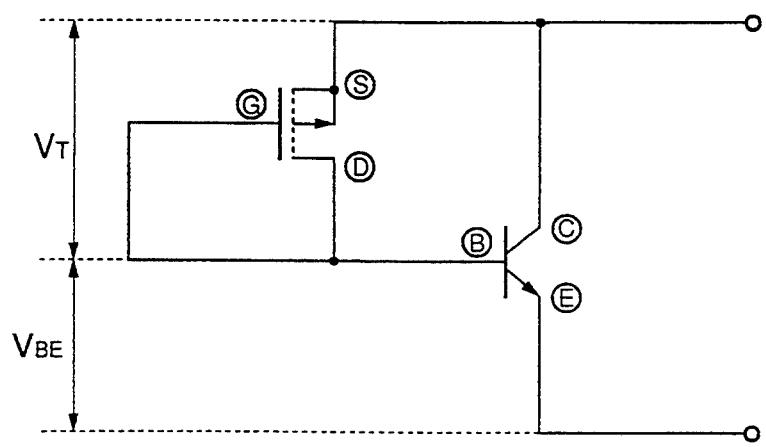
FIG. 2B is an equivalent circuit diagram of the diode shown in FIG. 2A.

Referring to FIG. 2A, there is shown a diagrammatic sectional view of a second embodiment of the constant voltage diode in accordance with the present invention. In addition, FIG. 2B is an equivalent circuit diagram of the diode shown in FIG. 2A. In FIGS. 2A and 2B, circled letters "C", "B" and "E" indicate a collector, a base and an emitter of a bipolar transistor, and also, circled letters "S", "D" and "G" designate a source, a drain and a gate of a MOS transistor.

As shown in FIG. 2A, the first embodiment of the diode includes an N type semiconductor substrate 10 having P-type diffusion regions 11 and 12 which are formed in a principal surface of the substrate 1. In addition, an N+ region 13 is formed in the P-type region 11, and another N+ region 14 is formed adjacent to the P-type region 12 and at an outside of the P-type region 12. After the oxide film used for the diffusion regions is removed, new oxide films 15 and 16 are formed on the principal surface of the substrate 10, as shown in the drawing. A portion of the oxide film 15 becomes a gate oxide film. Thereafter, ions are implanted to a channel region between the P-type regions 11 and 12 and under the gate oxide, for the purpose of controlling a turn-on voltage $V_T$ of the MOS transistor. Furthermore, electrodes 17, 18, 19 and 20 are formed as shown in FIG. 2A by an evaporation process. The electrode 7 forms as an emitter electrode of the bipolar transistor and a gate electrode of the MOS transistor.

The P-type region 11 constitutes a base of the bipolar transistor and a drain of the MOS transistor. The P-type region 12 constitutes a source of the MOS transistor.

The N+ region 14 constitutes a collector lead-out for a collector connection of the bipolar transistor, and the N+ region 13 constitutes an emitter of the bipolar transistor. The electrode 17 forms as a base electrode of the bipolar transistor and a gate electrode of the MOS transistor. The electrode 19 constitutes an emitter electrode of the bipolar transistor and the electrode 17 constitutes a collector electrode of the bipolar transistor and the source electrode of the MOS transistor. The electrode 20 is a substrate electrode or a back electrode.

Now, an operation of the semiconductor device shown in FIG. 2A will be described with reference to the equivalent circuit of FIG. 2B. When a negative voltage and a positive voltage are applied to the anode electrode 19 and the cathode electrode 20, respectively, if the applied voltage exceeds the $V_T + V_{BE}$ (forward direction base-emitter voltage), a drain current flows so that a current is injected to the base of the bipolar transistor. As a result, the bipolar transistor is turned on. Since the bipolar transistor exerts a current amplification, an operating resistance is low.

The diode pellet of the second embodiment has the breakdown voltage of $V_T + V_{BE}$. Since $V_T$ has a temperature coefficient of about 2 mV/°C. and $V_{BE}$ has a temperature coefficient of about −2 mV/°C., the breakdown voltage of the diode pellet has an extremely small temperature coefficient.

Figure 3A:
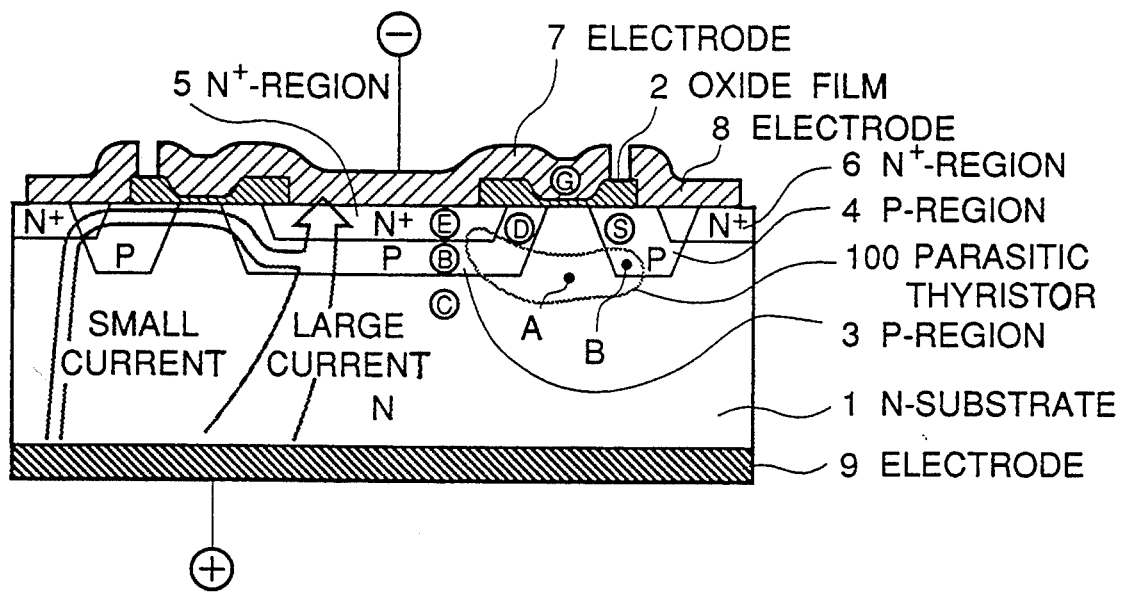
FIG. 3A is a diagrammatic sectional view of the first embodiment illustrating a parasitic thyristor in the first embodiment.
Figure 3B:
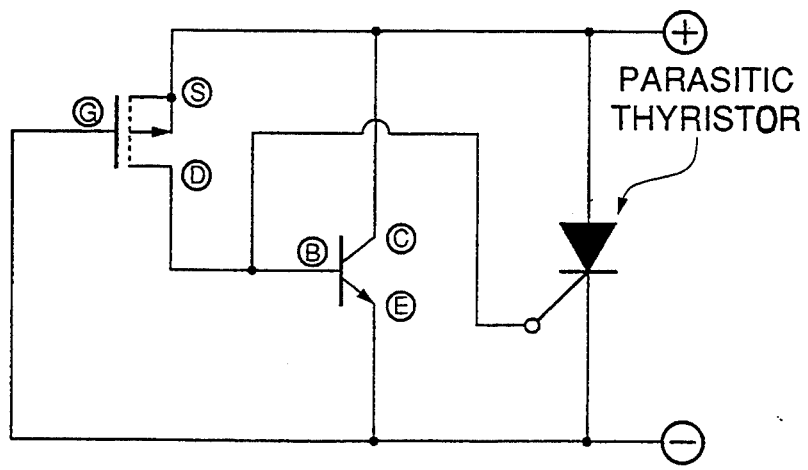
FIG. 3B is an equivalent circuit diagram of the diode shown in FIG. 3A.

In the first embodiment of the diode device, a parasitic thyristor exists as shown by a dotted line in FIG. 3A. Therefore, if a current exceeds a certain value, a thyristor action (negative resistance) occurs. This is similar in the second embodiment FIG. 3B shows an equivalent circuit diagram including the parasitic thyristor. In operation, illustrated in FIG. 3A, little electric current flows through the source of tho MOS transistor, and therefore, a voltage at a point B within the source region 4 is substantially the same as that of the back electrode 9. However, a voltage at a point A in a substrate region between the source region 4 and the drain and base region 3 becomes lower than that of the back electrode 9, since a voltage drop occurs in the N-type semiconductor substrate. Therefore, if a some degree of current becomes to flow, the following relationship is established:

{potential of point A} < {potential of point B} + {diffusion potential of PN junction}

Figure 3C:
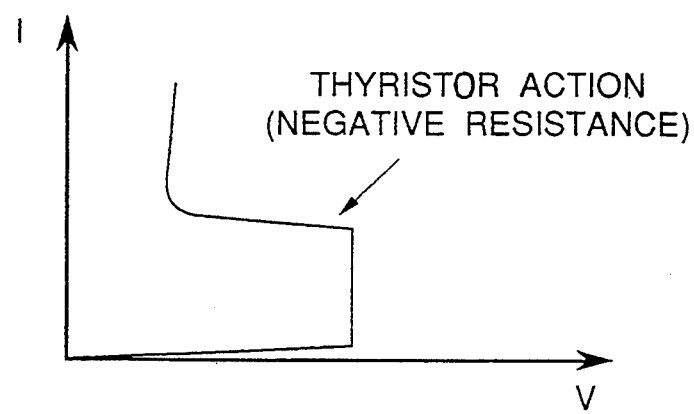
FIG. 3C is a diagrammatic graph illustrating an action of the thyristor.

Therefore, the parasitic thyristor having the characteristics as shown in FIG. 3C is turned on.

Figure 4:
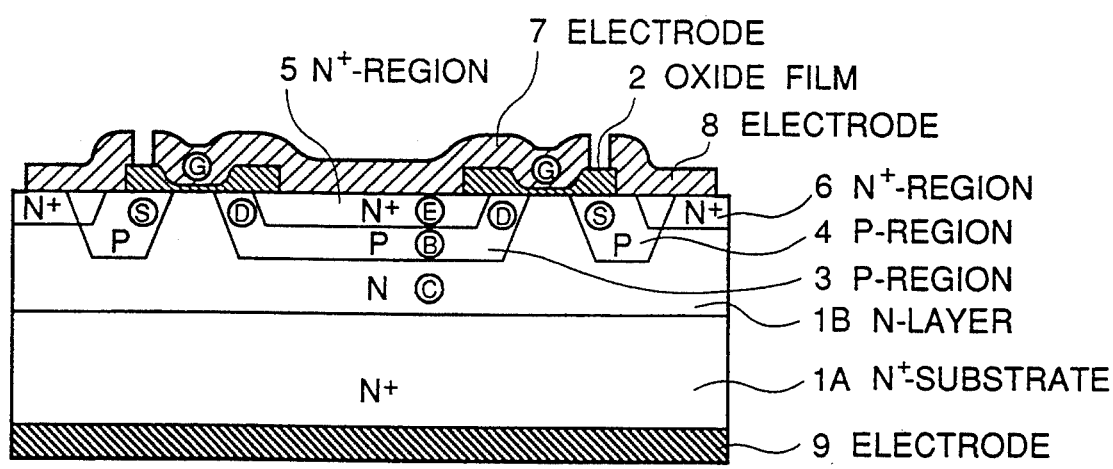
FIG. 4 is a diagrammatic sectional view of a third embodiment of the diode in accordance with the present invention.
Figure 5:
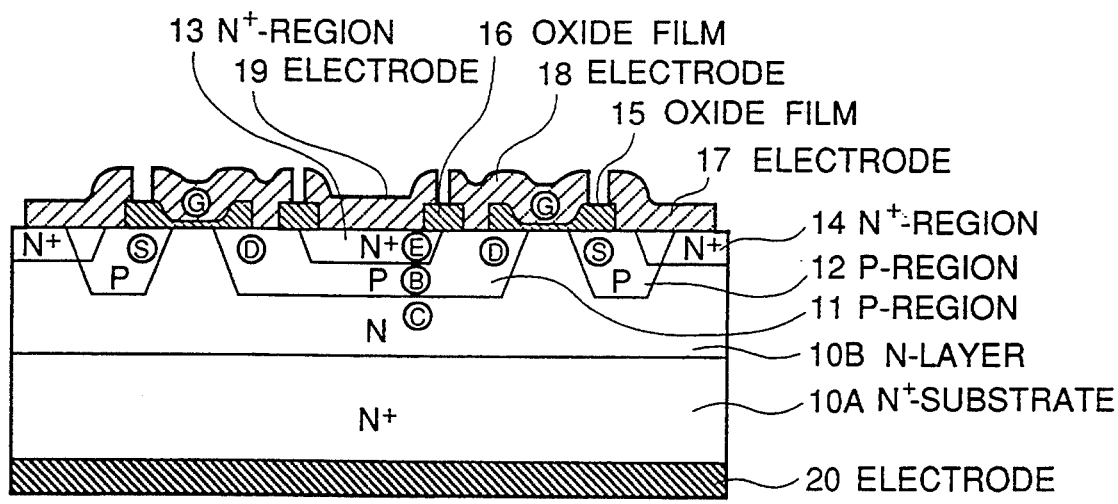
FIG. 5 is a diagrammatic sectional view of a fourth embodiment of the diode in accordance with the present invention.

The current value at which the thyristor action occurs is given by the following equation:

$$I_{thyristor} \approx (V_d \cdot A_p) / \{\pi \times (t_p - d_p)\}$$

where
$I_{thyristor}$ is the current value at which the thyristor action occurs
$V_d$ is a diffusion voltage of PN junction (about 0.6 V in the case of a silicon substrate
$A_p$ is an area of the pellet
$\pi$ is a specific resistance of semiconductor substrate
$t_p$ is a thickness of a pellet
$d_p$ is a depth of P-type region Therefore, in the case that the above mentioned device is used as a constant voltage diode, the current value at which the thyristor action occurs is included within an operating current range of the semiconductor device, a circuit including the semiconductor device will cause a malfunction. Therefore, in order to prevent this problem, as shown in FIGS. 4 and 5, the N-type substrates 1 and 10 can be respectively replaced with N+ substrate 1A and 10A of a low specific resistance on which N-type layer 1B and 10B having the same specific resistance as that of the N-type substrates 1 and 10 am epitaxially grown. Incidentally, in FIGS. 4 and 5, parts similar or corresponding to those shown in FIGS. 1A and 1B are given the same Reference Numerals. However, the device is designed to fulfil the following equation:

$$V_d > (I_{max}/A_p) / \{(\pi_N \cdot t_N) - (\pi_n \cdot t_p) + (\pi_n \cdot t_n)\}$$

where
$I_{max}$ is the maximum operating current value of the semiconductor device
$\pi_N$ is a specific resistance of N+ semiconductor substrate
$t_N$ is a thickness of N+ semiconductor substrate
$\pi_n$ is a specific resistance of N-type region
$t_p$ is a depth of P-type region
$t_N$ is a thickness of N-type region In accordance with the structures shown in FIGS. 1A and 2A, in the case of a sample having a pellet size of 0.40 mm square, a pellet thickness of 230 μm, an N type semiconductor substrate of a specific resistance 5Ω cm, and a P-type region of a depth 4 μm, the thyristor action occurs around 8 mA. On the other hand, in accordance with the structures shown in FIGS. 4 and 5, in the case of a sample having a pellet size of 0.40 mm square, an N-type layer of a thickness 7 μm and a specific resistance 5Ωcm, an N+ type semiconductor substrate of a thickness 223 μm and a specific resistance 8 mΩcm, and a P-type region of a depth 4 μm, the thyristor action occurs around 600 mA. Thus, it is possible to increase the current value at which the thyristor action occurs.

Figure 6A:
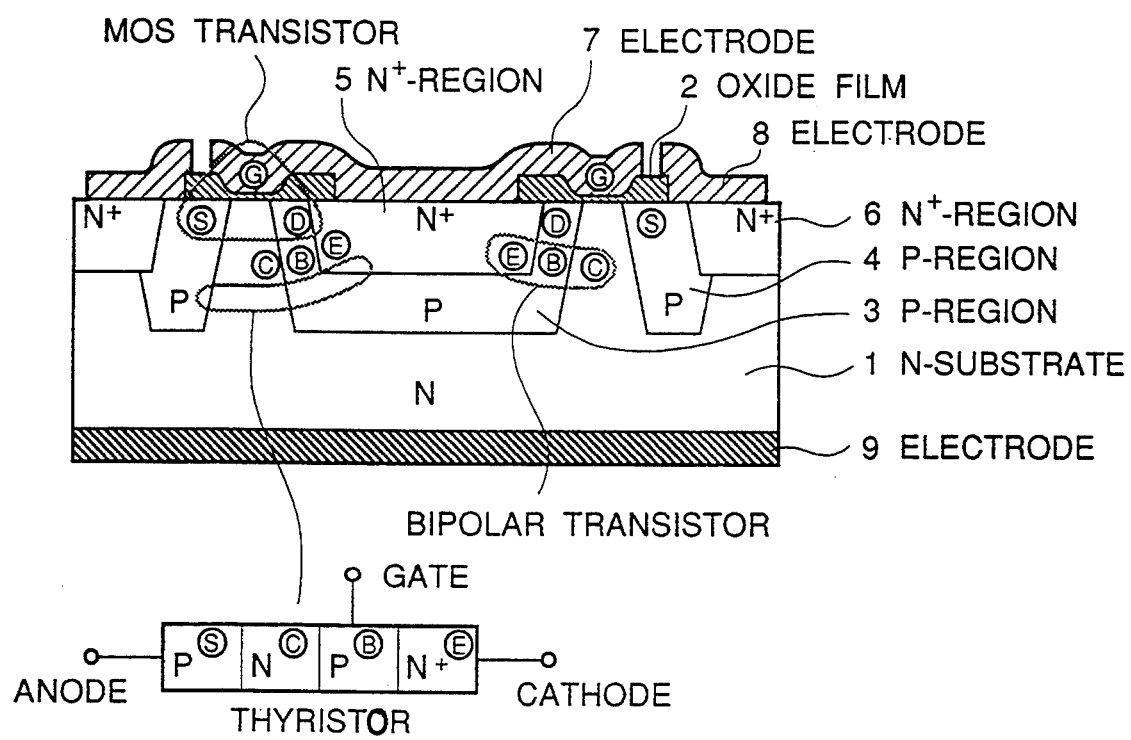
FIG. 6A is a diagrammatic sectional view of a fifth embodiment of the diode in accordance with the present invention.

However, the above mentioned thyristor can be positively utilized. FIG. 6A illustrates the diode device utilizing the thyristor in accordance with the second aspect of the present invention.

Figure 6B:
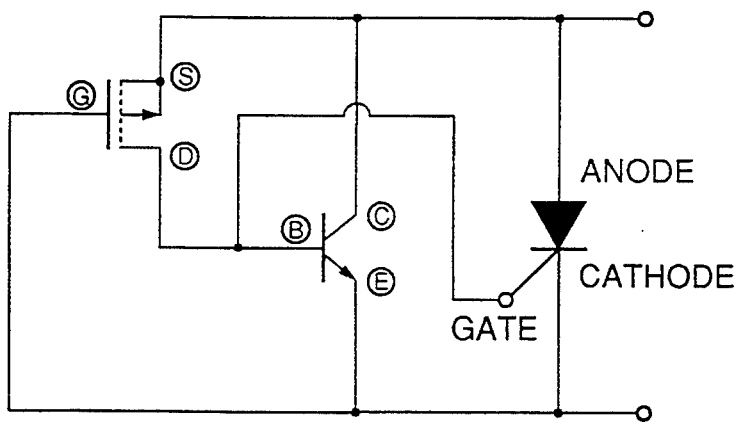
FIG. 6B is an equivalent circuit diagram of the diode shown in FIG. 1A.

As shown in FIG. 6A, the fifth embodiment of the diode includes an N type semiconductor substrate 1 having P-type diffusion regions 3 and 4 which are formed similarly to the first embodiment, for example, by selectively forming openings in an oxide film on a principal surface of the substrate 1 by means of a photoresist process, and by selectively diffusing a P-type impurity into the principal surface of the substrate 1 through the openings formed in the oxide film. In addition, an N+ region 5 is formed in the P-type region 3, and another N+ region 6 is formed adjacent to the P-type region 4 and at an outside of the P-type region 4. These N+ regions 5 and 6 can be formed similarly to the first embodiment. The oxide film used for formation of the diffusion regions is then removed, and a new oxide film, which becomes a gate oxide film 2, is formed on the principal surface of the substrate 1. Thereafter, ions are implanted to a channel region between the P-type regions 3 and 4 and under the gate oxide 2, for the purpose of controlling a turn-on voltage $V_T$ of the MOS transistor. Furthermore, an anode electrode 7, an electrode 8 and a cathode electrode 9 are formed as shown in FIG. 6A by an evaporation process. Thus, the diode of a pellet structure is formed. An equivalent circuit diagram of the device shown in FIG. 6A is shown in FIG. 6B.

Figure 7A:
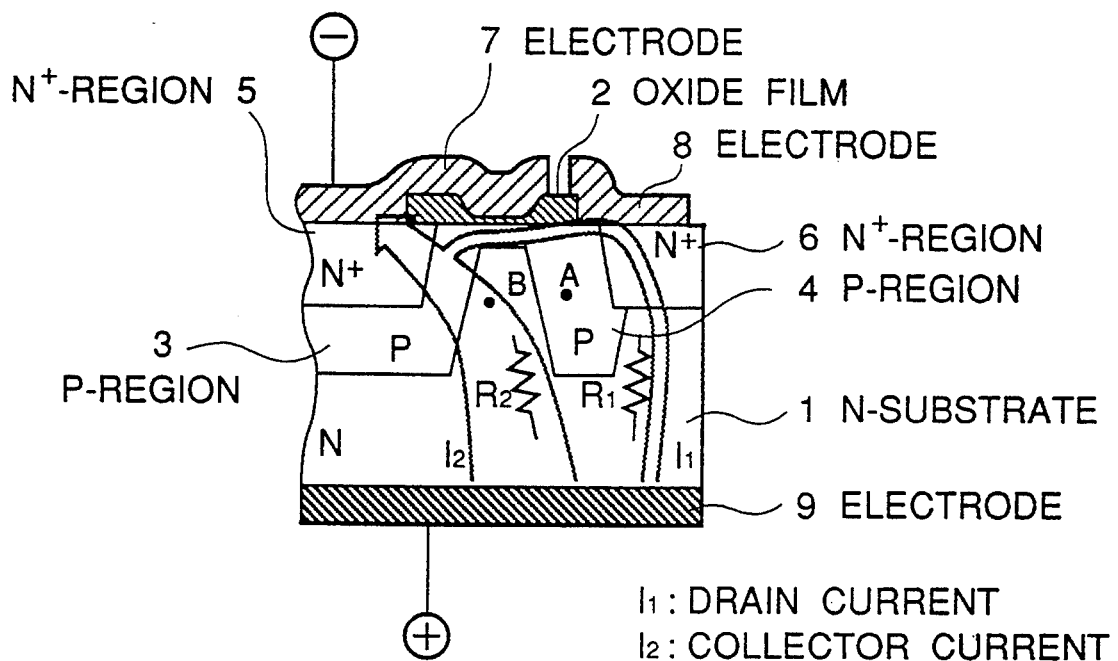
FIG. 7A is an enlarged diagrammatic partial sectional view of a fifth embodiment of the diode illustrating a thyristor in the fifth embodiment.

When a negative voltage and a positive voltage are applied to the anode electrode 7 and the cathode electrode 9, respectively, if the applied voltage exceeds the turn-on voltage $V_T$, a drain current flows as illustrated in FIG. 7A so that a current is injected to the base of the bipolar transistor and the gate of the thyristor. As a result, the bipolar transistor is mined on.

Accordingly, if the applied voltage exceeds the turn-on voltage $V_T$, the current starts to abruptly flow. To the contrary, when the applied voltage does not exceed the turn-on voltage $V_T$, little current flows. Namely, a leakage current is very small.

Figure 7B:
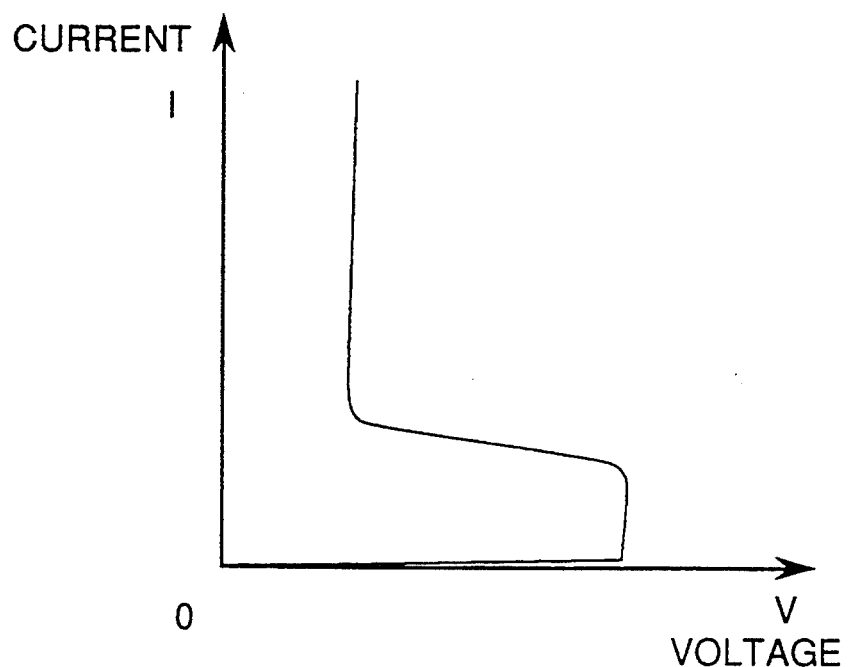
FIG. 7B is an equivalent circuit diagram of the diode shown in FIG. 7 A.

Referring to FIG. 7A, when a collector current $I_2$ is small, a potential at a point A is substantially the same as a potential at a point B, and therefore, the thyristor is not turned on. However, as the collector current $I_2$ becomes large, the potential of the point A drops by a voltage drop caused by an internal resistance $R_2$ of the substrate 1, and therefore, the thyristor is turned on. Since the thyristor has a voltage-current characteristics as shown in FIG. 7B, a leakage current of the thyristor is small.

Figure 8A:
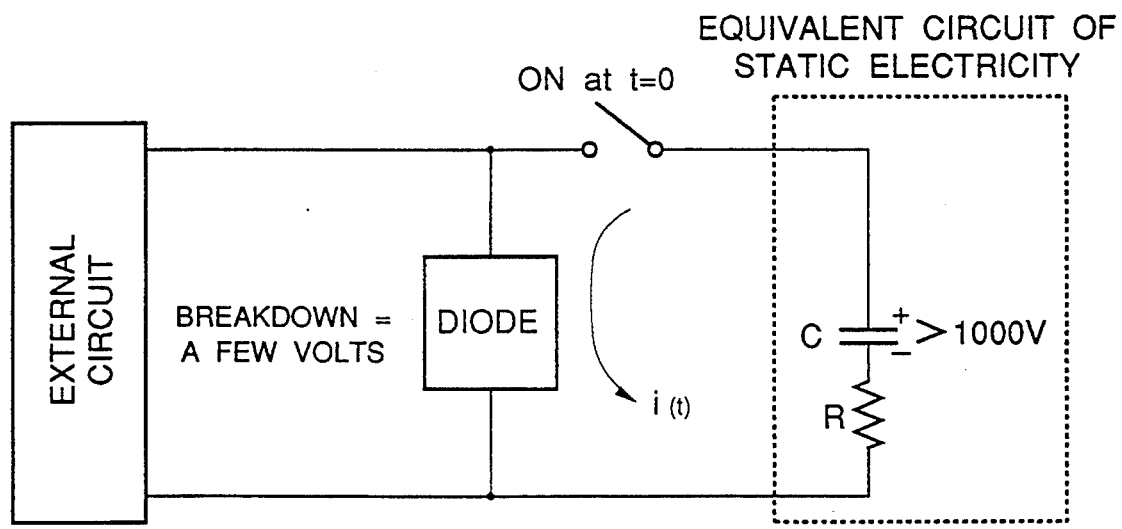
FIG. 8A is a diagrammatic circuit diagram of an external circuit for illustrating influence of a static electricity.

Here, referring to FIG. 8A, there is illustrate an equivalent circuit of a static electricity. A voltage of the static electricity is much higher than the breakdown voltage of the electrostatic protection diode, and therefore, a current i(t) flowing through the diode due to the static electricity is not subjected to the breakdown voltage of the diode, as would be understood from the following equation:

$$i_{(t)} = \{Vc - V_{breakdown}\}/R$$

where

Figure 8B:
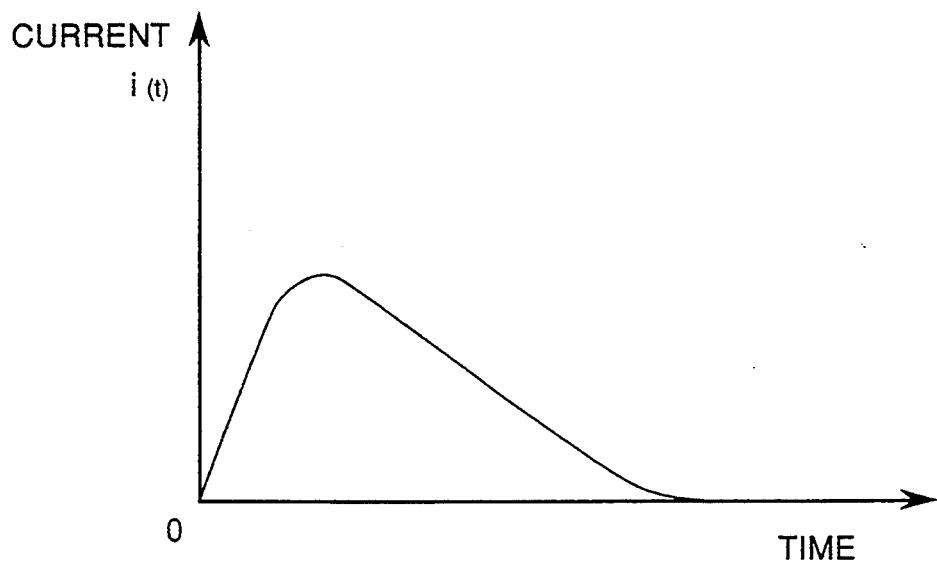
FIG. 8B is a diagrammatic graph illustrating a discharge process of the static electricity.

Vc is a voltage of Capacitor
$V_{breakdown}$ is a breakdown voltage of the diode
R is a resistance of Resistor Accordingly, a consumed power of the diode caused by the static electricity is expressed by {(breakdown voltage of the diode)$\times i_{(t)}$}. In other words, the lower the breakdown voltage of the diode is, the smaller the consumed power of the diode. FIG. 8B illustrates a change of a discharge current of the static electricity. From this FIG. 8B, it can be said that the smaller the current value $I_{thyristor}$ at which the thyristor action occurs is, the smaller the consumed power of the diode. Namely, the electrostatic breakdown current mount becomes larger if the thyristor action starting current $I_{thyristor}$ is lower.

In order to lower thyristor action starting current $I_{thyristor}$, it is necessary to enlarge the current amplification factor of the bipolar transistor in the device shown in FIG. 6A so that the current is concentrated at the surface of the substrate, and it is also necessary to increase the resistance of the N-type substrate, so that the voltage drop at the point B in FIG. 7A becomes large.

In addition, in order to realize a low capacitance and a high electrostatic breakdown current amount of the diode, the thickness of the gate oxide film 6 is made as large as possible. Furthermore, if the MOS transistor is in the form of a ting, a gate electrode portion of the anode electrode 7 can be partially removed in order to suppress or reduce the capacitance of the diode device.

In the case of manufacturing an electrostatic protection diode device for a circuit having an input/output signal voltage smaller than 5V, if the specific resistance of the N-type semiconductor substrate 1 is not less than 5 $\omega$cm and the gate oxide film 6 has the thickness of 1200Å or more, the electrostatic breakdown current amount can be improved.

Furthermore, if the junction area and the gate electrode size are adjusted so as to have the capacitance on the order to 10 pF or less, a signal waveform of the input/output signals at practical use levels are not disturbed or deformed.

In the diode device manufactured as mentioned above, the leakage current becomes a few nA or less. Accordingly, the embodiment of the structure in which the breakdown voltage is determined by the MOS transistor having a smaller leakage current, and on the other hand, the MOS transistor having only a small electrostatic breakdown current mount is protected by the thyristor.

Figure 9A:
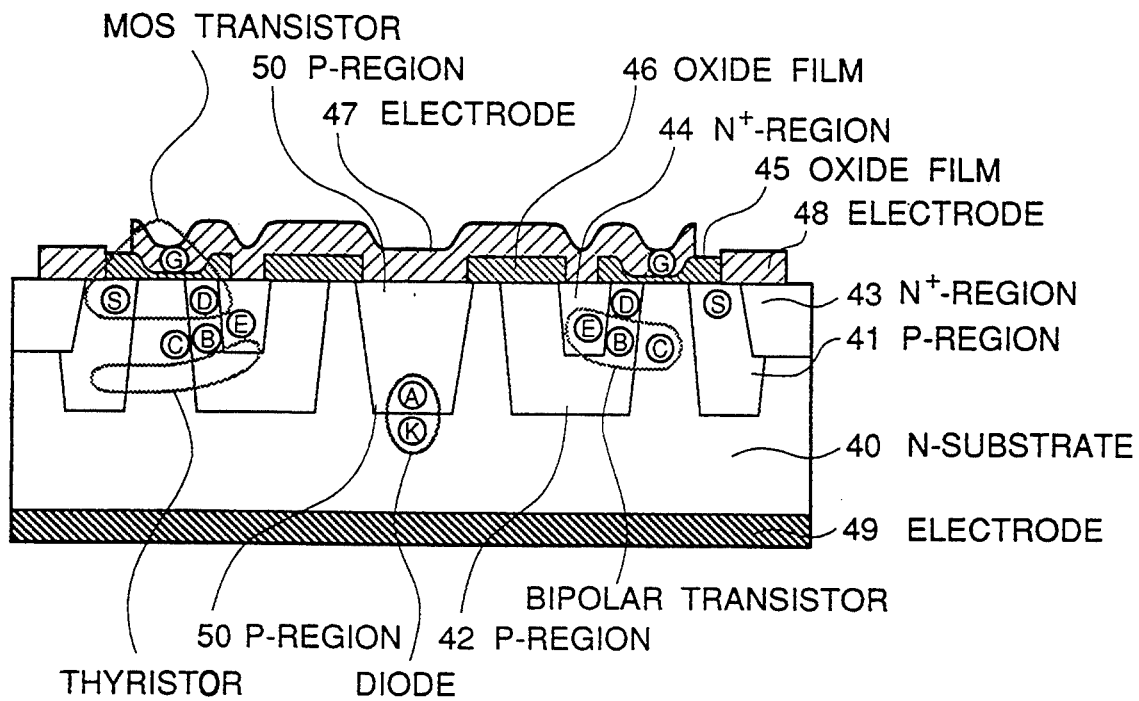
FIG. 9A is a diagrammatic sectional view of a sixth embodiment of the diode in accordance with the present invention.

Referring to FIG. 9A, them is shown another embodiment of the diode device utilizing the thyristor in accordance with the second aspect of the present invention.

Figure 9B:
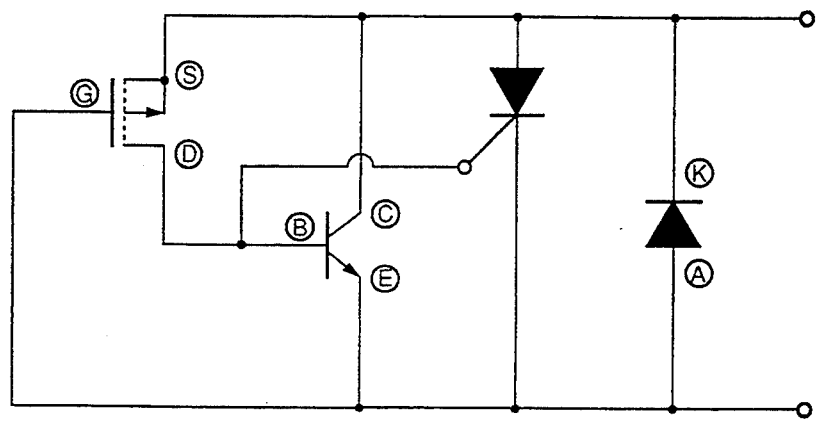
FIG. 9B is an equivalent circuit diagram of the diode shown in FIG. 9A.

As shown in FIG. 9A, the sixth embodiment of the diode includes an N type semiconductor substrate 40 having P-type diffusion regions 41, 42 and 50 which are formed for example, by selectively forming openings in an oxide film on a principal surface of the substrate 40 by means of a photoresist process, and by selectively diffusing a P-type impurity into the principal surface of the substrate 40 through the openings formed in the oxide film. Similarly, an N+ region 44 is formed in the P-type region 42, and another N+ region 43 is formed adjacent to the P-type region 41 and at an outside of the P-type region 41. These N+regions 4 and 5 can be formed by a selective diffusion process similarly to the first embodiment. The second patterned oxide film is also removed, and a gate oxide film 45 and another oxide film 46 are formed. Thereafter, ions are implanted to a channel region between the P-type regions 41 and 42 and under the gate oxide 45, for the purpose of controlling a ram-on voltage $V_T$ of the MOS transistor. Furthermore, an anode electrode 47, an electrode 48 and a cathode electrode 49 are formed as shown in FIG. 9A by an evaporation process. Thus, the diode of a pellet structure is formed which has a diode formed by the P-type diffusion region 50 and the N-type substrate 50. An equivalent circuit diagram of the device shown in FIG. 9A is shown in FIG. 9B.

The embodiment shown in FIG. 9A is characterized by including a diode in addition to the embodiment shown in FIG. 6A. When an electrostatic voltage is applied in a forward direction of the diode formed by the P-type diffusion region 50 and the N-type substrate 50, the electrostatic voltage is absorbed by the diode. On the other hand, if electrostatic voltage is applied in a reversed direction, the electrostatic voltage is absorbed by the thyristor similar to the embodiment shown in FIG. 6A.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device functioning as a diode, including:

an insulated-gate field effect transistor for determining a breakdown voltage; and a bipolar transistor connected to the field effect transistor for amplifying a drain current of the field effect transistor, said field effect transistor and said bipolar transistor being formed in a semiconductor substrate, wherein said field effect transistor and said bipolar transistor are formed at a first principal surface of said semiconductor substrate, and a source, a drain and a gate of the field effect transistor are connected to a collector, a base and an emitter of the bipolar transistor, respectively, so that a collector-emitter characteristic of the bipolar transistor is utilized as a constant voltage diode.

2. A semiconductor device claimed in claim 1 wherein said semiconductor substrate has a relatively high specific resistance and is covered with an epitaxial layer having a relatively low specific resistance, said field effect transistor and said bipolar transistor being formed in said epitaxial layer.

3. A semiconductor device functioning as a diode, including:
an insulated-gate field effect transistor for determining a breakdown voltage; and
a bipolar transistor connected to the field effect transistor for amplifying a drain current of the field effect transistor, said field effect transistor and said bipolar transistor being formed in a semiconductor substrate,
wherein said field effect transistor and said bipolar transistor are formed at a first principal surface of said semiconductor substrate, and a source of the field effect transistor is connected to a collector of the bipolar transistor, a drain and a gate of the field effect transistor being connected in common to a base of the bipolar transistor, so that a collector-emitter characteristic of the bipolar transistor is utilized as a constant voltage diode.

4. A semiconductor device claimed in claim 3 wherein said semiconductor substrate has a relatively high specific resistance and is covered with an epitaxial layer having a relatively low specific resistance, said field effect transistor and said bipolar transistor being formed in said epitaxial layer.

5. A semiconductor device including:
an insulated-gate field effect transistor for minimizing the leakage current and for determining a breakdown voltage;
a bipolar transistor connected to the field effect transistor for amplifying a drain current of the field effect transistor; and
a thyristor coupled to the field effect transistor and the bipolar transistor for improving an electrostatic breakdown current,
wherein a source of the field effect transistor, a collector of the bipolar transistor and an anode of the thyristor are interconnected, and a drain of the field effect transistor, a base of the bipolar transistor and a gate of the thyristor are interconnected, and also, a gate of the field effect transistor, an emitter of the bipolar transistor and a cathode of the thyristor are interconnected.

* * * * *